United States Patent [19]
Jeon

[11] Patent Number: 5,930,166
[45] Date of Patent: Jul. 27, 1999

[54] SEMICONDUCTOR MEMORY DEVICE WITH TRIPLE METAL LAYER

[75] Inventor: Jun-Young Jeon, Seoul, Rep. of Korea

[73] Assignee: Samsung Electronics, Co. Ltd., Suwon, Rep. of Korea

[21] Appl. No.: 08/986,905

[22] Filed: Dec. 8, 1997

[30] Foreign Application Priority Data

Dec. 6, 1996 [KR] Rep. of Korea .................. 96/62410

[51] Int. Cl.$^6$ .................................................. G11C 11/34
[52] U.S. Cl. ............................................ 365/174; 257/48
[58] Field of Search .................... 365/182, 180; 257/48, 532

[56] References Cited

U.S. PATENT DOCUMENTS

| | | | |
|---|---|---|---|
| 5,315,130 | 5/1994 | Hively et al. | 257/48 |
| 5,726,485 | 3/1998 | Grass | 257/532 |

Primary Examiner—David Nelms
Assistant Examiner—David Lam
Attorney, Agent, or Firm—Marger, Johnson & McCollom, P.C.

[57] ABSTRACT

A semiconductor memory device formed using a triple metal process to minimize the chip area required to define such a circuit. The semiconductor memory device having a memory cell array and a peripheral circuit for reading and writing data from and into a memory cell. The peripheral circuit includes a circuit layer, a first servicing circuit, a second servicing circuit and a third servicing circuit. The circuit layer, such as a decoder or buffer, defines a peripheral circuit layer area of a semiconductor chip. The first servicing circuit, preferably input/output lines, is defined vertically relative to said peripheral circuit layer area in a first metal layer located in said semiconductor chip. The second servicing circuit, preferably signal bussing lines, is defined vertically relative to said first servicing circuit in a second metal layer located in said semiconductor chip. Finally, the third servicing circuit, such as a power line layer, is defined in a third meal layer vertically relative to said second servicing circuit.

11 Claims, 3 Drawing Sheets

SEMICONDUCTOR MEMORY DEVICE WITH TRIPLE METAL LAYER

BACKGROUND OF THE INVENTION

1. Field of the Invention

The present invention relates to a semiconductor memory device and, more particularly, to a semiconductor memory device multilayer design that reduces the area required for the peripheral support circuit portion of the memory device.

The present application is based on Korean Patent Application No. 96-62410 which is incorporated herein by reference for all purposes.

2. Description of the Related Art

A semiconductor memory device generally includes two primary components—the memory cell array itself and the peripheral support circuit having multiple input/output lines for reading data from and writing data to the memory cells. The area of the semiconductor memory circuit dedicated to these two components is roughly equal where each component takes up half of the total circuit area. With the increasing integration of semiconductor memory devices, the area necessary to define a memory cell on a circuit has been considerably reduced by using new cell structure designs and other methods. In contrast, reduction of the peripheral circuit layout has made relatively slow progress. The metal width and metal-metal spacing in the metal wiring layer is not reduced since a markedly stepped surface is formed between the memory cell array and the layout of the peripheral circuit just before the metalizing process during chip fabrication. Therefore, an area occupied by a signal bussing line is a considerable restrictive factor in reducing the area of the peripheral circuit.

FIG. 1 shows a conventional plan view distribution of power lines and signal bussing lines servicing a circuit layer 1 of a peripheral circuit. The region occupied by the circuit layer 1 (which can, for instance, be a decoder circuit, a buffer circuit, etc.) is shown in dashed outline to show the approximate area of the chip required for the circuit layer 1. Such an area is generally referred to herein as the "peripheral circuit layer area." It is to be appreciated that a circuit designer would desire the area required for the entire peripheral circuit to be as close to the area required for the circuit layer 1 as possible.

In FIG. 1, power line layers 2-1 and 2-2 are formed in a layer above the circuit layer 1 in which the peripheral circuit is arranged. An input/output line 3 of the peripheral circuit and a signal bussing layer 4 connected to the input/output line 3 and to the exterior are formed in a region located beside the circuit layer 1.

If a double metal process is used, the input/output line 3 of the peripheral circuit is formed in the first metal layer, and the power line layers 2-1 and 2-2 and the signal bussing layer 4 are formed in the second metal layer which is different from the first metal layer. This design yields the following vertical arrangement: the circuit layer 1 at the lowest layer, then an insulating layer formed on top of the circuit layer 1, then a first metalized layer, then another insulating layer, and then the second metalized layer. Operative layers can be connected to one another via pass-throughs formed in the insulating layer. Since the power line layers 2-1 and 2-2 and the signal bussing layer 4 occupy a nearly constant area irrespective of the degree to which the semiconductor memory device is integrated, they are a restrictive factor in reducing the layout area of the peripheral circuit. Therefore, the arrangement shown in FIG. 1 would not be very useful in reducing the chip "real estate" required for the peripheral control circuit in the semiconductor memory device.

FIG. 2 shows another conventional layout of the power line and signal bussing line of the peripheral circuit. The input/output line 3 of the peripheral circuit and the signal bussing layer 4 connected thereto are formed in circuit layers disposed above the circuit layer 1. The power line layers 2-1 and 2-2 are separately arranged outside the circuit layer 1.

If the double metal process is used, the input/output line 3 of the peripheral circuit is formed in the first metal layer and the signal bussing layer 4 is formed in the second metal layer. Since there is no layout at a lower layer of the power line layers 2-1 and 2-2, the power line layers 2-1 and 2-2 can be separately formed in the first metal layer and the second metal layer. Therefore, the width of the power line layers 2-1 and 2-2 can be reduced by half. Though the area of the peripheral circuit is reduced compared with the layout of FIG. 1, the power line layers 2-1 and 2-2 are still formed outside of the circuit layer 1 in which the peripheral circuit is formed, therefore increasing the total size of the chip.

Accordingly, the need remains for a peripheral circuit design for a memory device having a reduced footprint on the chip.

SUMMARY OF THE INVENTION

It is, therefore, an object of the invention to provide a semiconductor memory device which can minimize the area of a peripheral control circuit by vertically arranging a power line, a signal bussing line and an input/output line using a triple metal process so as not to be restricted by a design rule of a metal wiring layer.

It is another object of the invention to provide a highly integrated semiconductor memory device having a vertically formed power line, signal bussing line and input/output line on a peripheral circuit within the same region as the peripheral circuit, thus minimizing chip size.

In accordance with one aspect of the invention, a semiconductor memory device having a memory cell array and a peripheral circuit for reading and writing data from and into a memory cell includes a circuit layer, a first servicing circuit, a second servicing circuit and a third servicing circuit. The circuit layer, such as a decoder or buffer, defines a peripheral circuit layer area of a semiconductor chip. The first servicing circuit, preferably input/output lines, is defined vertically relative to said peripheral circuit layer area in a first metal layer located in said semiconductor chip. The second servicing circuit, preferably signal bussing lines, is defined vertically relative to said first servicing circuit in a second metal layer located in said semiconductor chip. Finally, the third servicing circuit, such as a power line layer, is defined in a third meal layer vertically relative to said second servicing circuit.

The present invention will be more specifically described with reference to the attached drawings. In the drawings, like reference numerals or symbols designate like elements throughout several views.

DETAILED DESCRIPTION OF THE DRAWINGS

Figure 3:
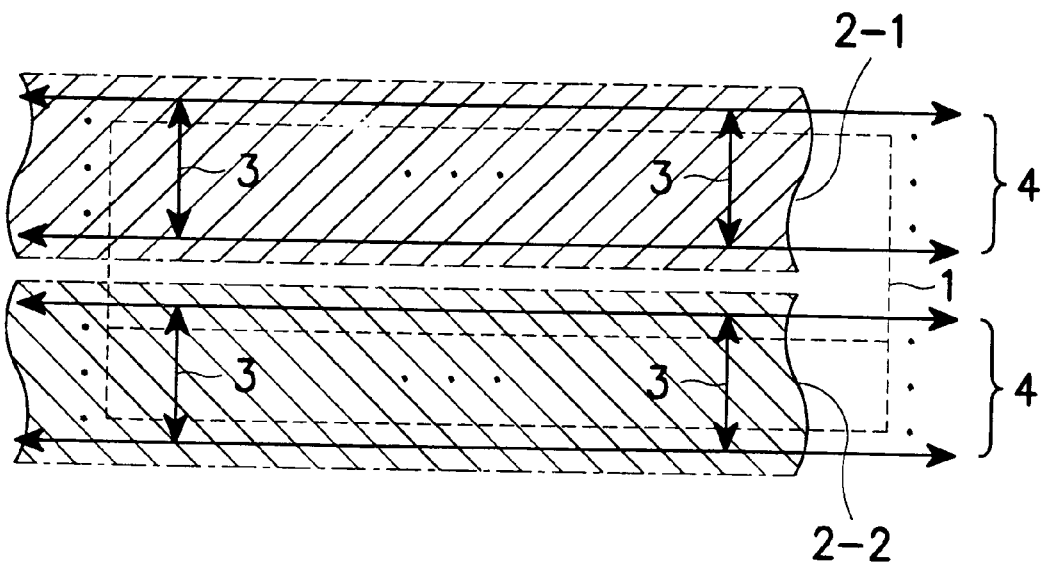
FIG. 3 shows a layout of a power line and signal bussing line of a peripheral circuit according to the present invention.

Referring to FIG. 3, the signal bussing layer 4 is vertically formed at an upper portion of or above the circuit layer 1 in which an N-channel transistor and a P-channel transistor are arranged. The term "vertically arranging" or "vertically forming" is intended to mean that the first metal layer and the second metal layer are disposed in planes and spaced along an axis located transverse to the surface of the semiconductor chip on which the memory device is defined.

The power line layers 2-1 and 2-2 include at least one power line supplied to the peripheral circuit. Such layers are vertically formed at the upper portion of or above the signal bussing layer 4 within the same region as the signal bussing layer 4. The input/output line 3 of the peripheral circuit is formed at the circuit layer 1.

Figure 1:
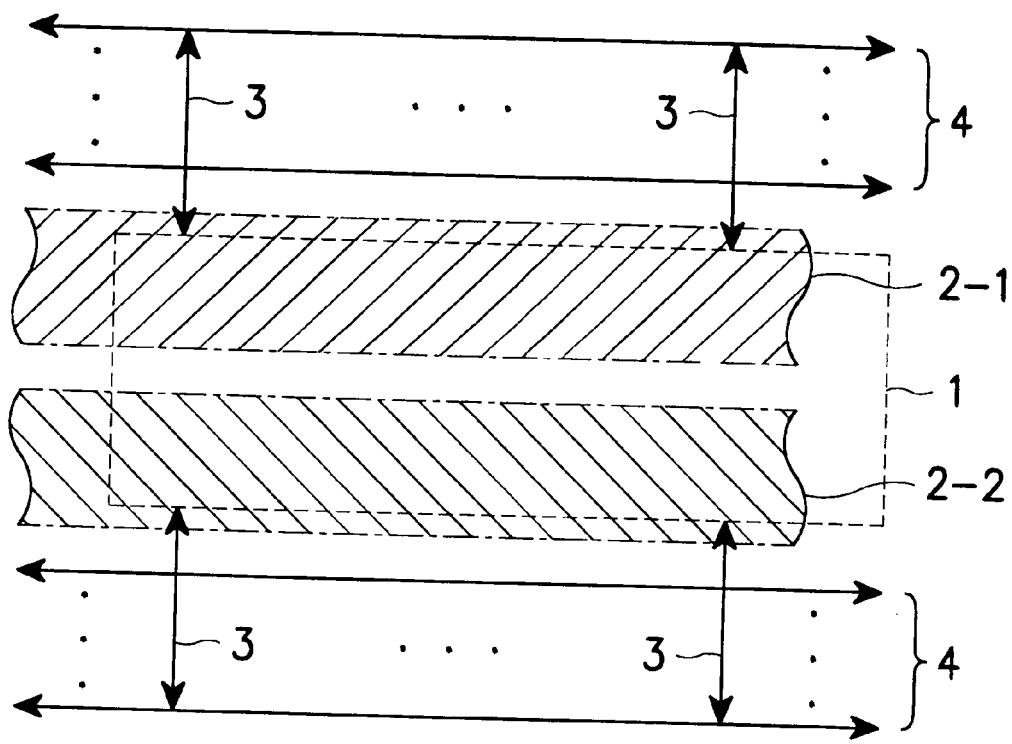
FIG. 1 shows a conventional layout of a power line and signal bussing line of a peripheral circuit.
Figure 2:
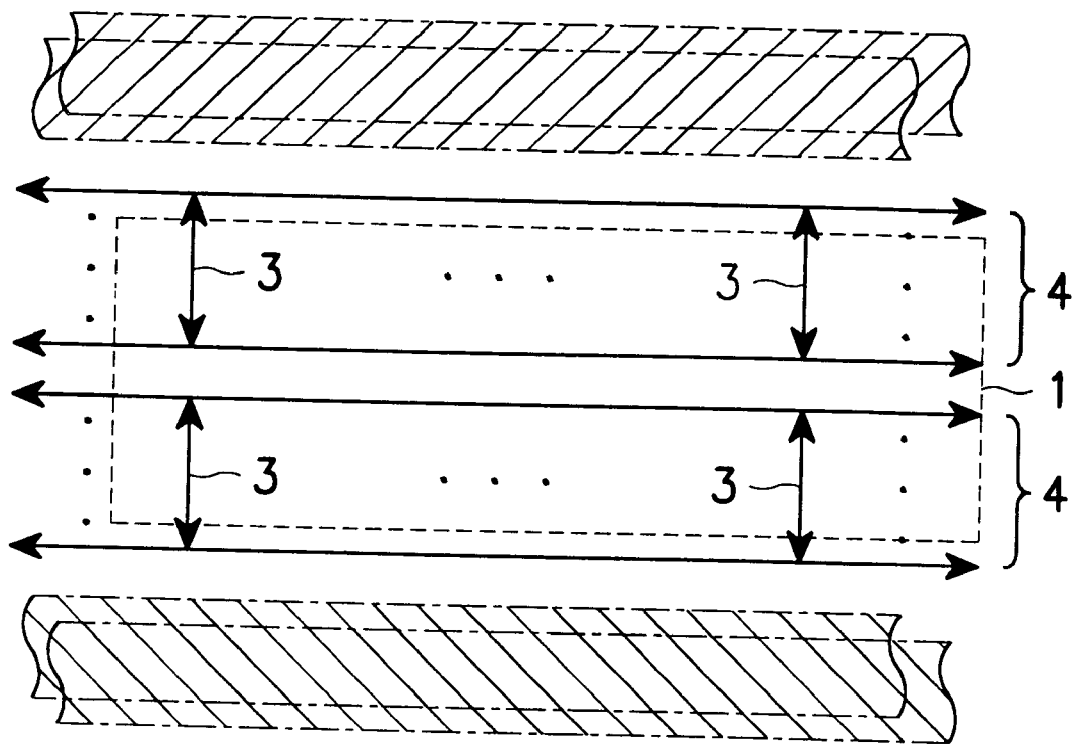
FIG. 2 shows another conventional layout of a power line and signal bussing line of a peripheral circuit.

Since power lines, input/output lines and signal bussing lines are all arranged on top of one another within the same peripheral circuit layer area of the peripheral circuit, the area disposed laterally of the circuit layer 1 required for servicing circuits such as I/O, bussing and power lines can be reduced or eliminated altogether from previous designs such as shown in FIGS. 1 and 2. To achieve this, a triple metal process should be used instead of the double metal process. The input/output line 3 of the peripheral circuit arranged at the same region as the circuit layer 1 is formed in a first metal layer; the signal bussing layer 4 arranged at the upper portion of the first metal layer is formed in a second metal layer; and the power line layers 2-1 1 and 2-2 arranged at the upper portion of the second metal layer are formed in a third metal layer. These layers can be separated from one another by interposed insulative layers that include pass-throughs to couple the layers together.

As described above, the peripheral circuit and the signal lines are arranged by using the triple metal process. Since there is no additional region occupied by the signal bussing layer and the power line layers except an area occupied by the circuit layer, such an arrangement is not restricted by the design rule of the chip related to the metal wiring layer. Therefore, the layout area of the peripheral circuit can be minimized.

It should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A peripheral circuit layout of a semiconductor memory device for reading and writing data from and into a memory cell, said peripheral circuit comprising:

a circuit layer defining a peripheral circuit layer area of a semiconductor chip;

a first servicing circuit defined in a first metal layer located in said semiconductor chip vertically relative to said peripheral circuit layer area;

a second servicing circuit defined in a second metal layer located in said semiconductor chip vertically relative to said first servicing circuit; and a third servicing circuit defined in a third metal layer located in said semiconductor chip vertically relative to said second servicing circuit, wherein each of the first, second and third servicing circuits are dedicated to a respective one selected from the group consisting of input/output lines, signal bussing lines and power lines.

2. The peripheral circuit layout of claim 1 wherein said first, second and third servicing circuit are input/output lines, signal bussing lines and power lines respectively.

3. The peripheral circuit layout of claim 1, wherein said first servicing circuit includes input/output lines coupled to said circuit layer and wherein said fist servicing circuit is sandwiched between said circuit layer and said second and third servicing circuits.

4. The peripheral circuit layout of claim 3, wherein said second servicing circuit includes signal bussing lines sandwiched between said first servicing circuit and said third servicing circuit.

5. The peripheral circuit layout of claim 4, wherein said third servicing circuit includes power lines add to supply power voltage to said circuit layer.

6. The peripheral circuit layout of claim 5, wherein each servicing circuit is separated from adjacent servicing circuits by an insulating layer.

7. A semiconductor memory device having a memory cell array and a peripheral circuit for reading and writing data from and into a memory cell, said semiconductor memory device comprising:

a circuit layer of a first metal layer at which said peripheral circuit and input/output lines connected thereto are formed;

a signal bussing layer of a second metal layer formed vertically at an upper portion of said circuit layer within the same region as and vertically aligned with said circuit layer, signal bussing lines connected to said input/output lines being formed at said circuit layer; and a power line layer of a third metal layer connected to said peripheral circuit to supply a power voltage and formed vertically at a upper portion of said signal bussing layer within the same region as and vertically aligned with said circuit layer.

8. A semiconductor memory device as claimed in claim 7, wherein said input/output lines are mutually cross-connected to said signal bussing lines.

9. A semiconductor memory device as claimed in claim 7, wherein said circuit layer comprises an N-channel transistor and a P-channel transistor.

10. A semiconductor memory device as claimed in claim 7, wherein said power line layer includes at least one power line.

11. A semiconductor memory device as claimed in claim 10, wherein said power line comprises an external power voltage line or a ground voltage line.

* * * * *

UNITED STATES PATENT AND TRADEMARK OFFICE
CERTIFICATE OF CORRECTION

PATENT NO.   : 5,930,166
DATED        : July 27, 1999
INVENTOR(S)  : Jun-Young Jeon It is certified that error appears in the above-identified patent and that said Letters Patent is hereby corrected as shown below:

Column 3,
Line 29, "2-11" should be -- 2-1 --.

Column 4,
Line 13, "fist" should be -- first --.
Line 22, "add" should be -- adapted --.

Signed and Sealed this

Twenty-ninth Day of October, 2002

Attest:

Attesting Officer

JAMES E. ROGAN
Director of the United States Patent and Trademark Office